METHOD OF MANUFACTURING SEMICONDUCTOR DEVICES

Filed June 30, 1967 6 Sheets-Sheet 1

Inventor:
Hans-Jürgen Maute
BY Spencer & Kaye
Attorneys

METHOD OF MANUFACTURING SEMICONDUCTOR DEVICES

Filed June 30, 1967

6 Sheets-Sheet 2

Inventor:
Hans-Jürgen Maute
BY Spencer & Kaye
Attorneys

Feb. 10, 1970 HANS-JÜRGEN MAUTE 3,494,022

METHOD OF MANUFACTURING SEMICONDUCTOR DEVICES

Filed June 30, 1967 6 Sheets-Sheet 3

Inventor:
Hans-Jürgen Maute
BY Spencer & Kaye
Attorneys

Feb. 10, 1970 HANS-JÜRGEN MAUTE 3,494,022

METHOD OF MANUFACTURING SEMICONDUCTOR DEVICES

Filed June 30, 1967

6 Sheets-Sheet 4

Inventor:
Hans-Jürgen Maute
BY Spencer & Kaye
Attorneys

Inventor:
Hans-Jürgen Maute
BY Spencer & Kaye
Attorneys

Inventor:
Hans-Jürgen Maute
BY Spencer & Kaye
Attorneys

United States Patent Office 3,494,022
Patented Feb. 10, 1970

3,494,022
METHOD OF MANUFACTURING SEMICONDUCTOR DEVICES

Hans-Jürgen Maute, Heilbronn-Bockingen, Germany, assignor to Telefunken Patentverwertungsgesellschaft m.b.H., Ulm-Donau, Germany Filed June 30, 1967, Ser. No. 650,299
Claims priority, application Germany, June 30, 1966, T 31,493
Int. Cl. B01j *17/00;* H01l *1/16*
U.S. Cl. 29—577 20 Claims

ABSTRACT OF THE DISCLOSURE

Electrode leads are attached to semiconductor bodies on a mass production basis by forming several groups of elongated elements in a flat sheet of conductive material, placing the semiconductor bodies on the elongated elements of one group, bending the rung elements toward each other to contact the corresponding conductivity zones of the semiconductor bodies, encapsulating the semiconductor bodies and the ends of the elongated elements which are in contact therewith, and cutting the elongated elements loose from the strip of conductive material to form a plurality of encapsulated semiconductor devices each having a conductive strip attached to each different conductivity zone of the semiconductor body thereof.

BACKGROUND OF THE INVENTION

The present invention relates to a method for attaching electrode leads to semiconductor devices which provides increased efficiency and a substantial simplification of the previously employed method. In the past, the electrode leads for semiconductor devices have been attached by a wire contacting method in which thin wire leads are fastened manually and with the aid of known thermocompression techniques to the electrodes of semiconductor devices or to their contact elements. This wire contacting method, however, is relatively expensive and time consuming.

SUMMARY OF THE INVENTION

It is the object of this invention to provide a simpler, more efficient, and less expensive method of attaching electrode leads to semiconductor devices.

In accordance with this invention, at least two groups of elongated elements such as rungs or teeth are formed in a flat strip of conductive material, one group of elongated elements being dimensioned and positioned to support a plurality of semiconductor bodies and to make contact with one conductivity zone thereof, and the other group of elongated elements being dimensioned and positioned to contact a different conductivity zone of the semiconductor bodies when bent toward the bodies. In the case of a transistor, three groups of elongated elements are formed. The semiconductor bodies are placed on one group of elongated elements, the other groups of rungs are bent to make contact with the semiconductor bodies, then the semiconductor bodies are encapsulated and the elongated elements are cut free of the flat strip of conductive material and form electrode leads for the corresponding semiconductor device.

Diodes, transistors, and integrated circuits can be quickly and easily fabricated by the method of this invention with correspondingly constructed conductive strips. If the conductive strip is formed so that portions of the strip can be definitely folded onto other portions thereof, only one adjustment of the fabricating machinery in relation to the conductive strip is necessary, since all spacings on the conductive strip are always exactly repeated, so that the semiconductor devices can be automatically soldered to portions of the conductive strip and the remaining electrodes can be connected thereto by folding the strip at an exactly defined point. The above-noted elongated portions of the conductive strip can constitute rungs, tongues or teeth connected to the conductive strip. It is necessary that such a conductive strip must be held to extremely close tolerances in its dimensions. It should be advantageous, therefore, to fabricate the conductive strip with the aid of mask and photoetching techniques, although the strip can, of course, also be stamped out of a metal strip if the tolerances of the stamping device can be kept close enough.

With such a conductive strip, planar transistors, in particular, can be contacted whose collector zone is disposed on one surface side and whose emitter and base zones are disposed on the opposite surface side. Since the semiconductor body is soldered with its collector zone to a rung or tongue of the conductive strip, good heat conduction, high current amplification, and a high cutoff frequency are guaranteed. Since rungs, rung portions, teeth or tongues are also provided on the conductive strip to contact the emitter electrode and the base electrode, the contacting method of this invention is particularly suited for planar transistors whose emitter and base electrodes extend out of the semiconductor body. For this purpose, the emitter zone and the base zone on the surface of the semiconductor body can first be provided with metal contacts, then the surface can be covered with a glass passivation layer in which openings are made photolithographically above the semiconductor zones. Contacting material is subsequently deposited into these openings from a metal or a metal alloy, which contacting material extends out of the surface of the glass passivation layer or another type of insulating layer.

The method according to the present invention can also be used, however, for planar transistors whose emitter and base contacts are connected via transmitting paths on the semiconductor device to metallically covered platforms of insulating material on the surface of the semiconductor body. In this case, it is advantageous to indent the rungs, teeth or tongues which are to be connected to the contact areas on the platforms so that protuberances are created on the surface of the tongues, teeth or rungs facing the contact areas of the semiconductor body, which protuberances are then connected with the contact points on the platforms of insulating material by the thermocompression method.

The semiconductor body and their electrode leads preferably encapsulated in an insulating material before the portions connecting the rungs, teeth or tongues of the conductive strip are removed. Only then are the individual structural elements separated. The rung, teeth or tongue portions extending out of the insulating material can be used as electrode leads in subminiature transistors without a housing or these rung, teeth or tongue portions can be connected with the associated prongs of a housing base to produce encased semiconductor devices as used commercially.

DESCRIPTION OF THE PREFERRED EMBODIMENTS

Figure 1:
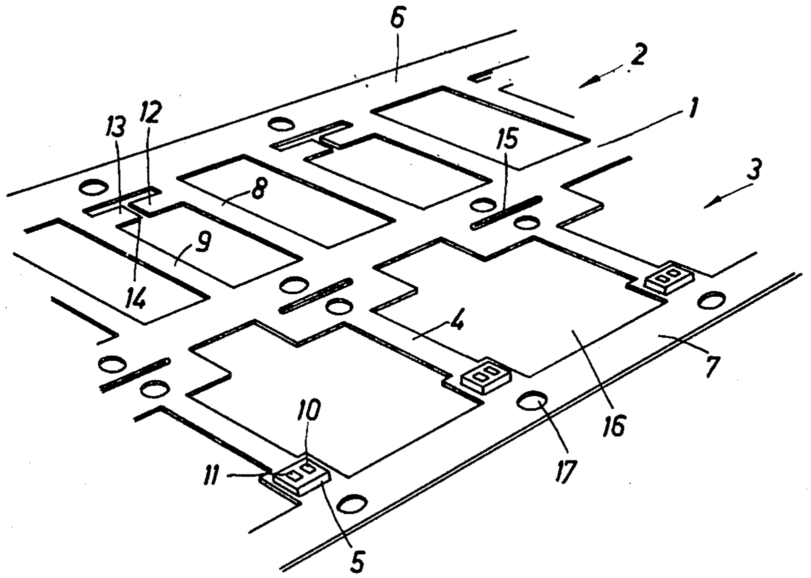
FIGURE 1 is a perspective view of a first conductive strip to be utilized in the method of this invention.

FIGURE 1 shows a suitable conductive strip for the manufacture of planar transistors in accordance with the method of this invention, the strip being in the shape of two ladders 2 and 3 connected to each other by means of a common longitudinal member 1. The rungs 4 of the ladder 3 serve to support and contact the collector zone of semiconductor bodies 5 which are mounted thereon. The conductive strip is provided with two outer longitudinal members 6 and 7 in order to increase the stability of the thin metal strip, the rungs of the two ladders 2 and 3 being connected to each other via outer longitudinal members 6 and 7.

Two rungs 8 and 9 are provided on the ladder 2 for each semiconductor body to be contacted, these rungs being utilized to contact the base and emitter electrodes 10 and 11 of the semiconductor body 5. The two rungs 8 and 9 are each provided with an inwardly extending tongue 12 and 13, respectively, which tongues are separated by only a narrow gap 14, and which are disposed so that when ladder 3 is turned by 180° to come to rest on top of ladder 2, the base and emitter electrodes 10 and 11, respectively, come in contact with tongues 12 and 13 and form an electrically conductive connection.

The center longitudinal member 1 of the conductive strip is prepared in such a manner that the center of this longitudinal member forms the axis around which the strip portions are folded. For this purpose, a perforation is provided in the center of longitudinal member 1. This perforation can be in the form of consecutive holes, or, as shown in the figures, in the form of repeated narrow slits 15. A portion 16 of the center bar is removed up to the center thereof, i.e., up to the perforation, between each two rungs 4 of ladder 3 in order to be able to fold each rung 4 with its semiconductor body 5 individually onto ladder 2 to contact tongues 12 and 13. The longitudinal members 1, 6 and 7 of the conductive strip are provided with holes 17 which serve first of all as sprocket holes to move the strip through partially or fully automatic fabricating machinery. The holes 17 are disposed in exactly defined positions in relation to the rungs, so that, for example, during insertion of semiconductor bodies by means of a vacuum probe, these semiconductor bodies are always soldered onto the same spot on rung 4.

Figure 2:
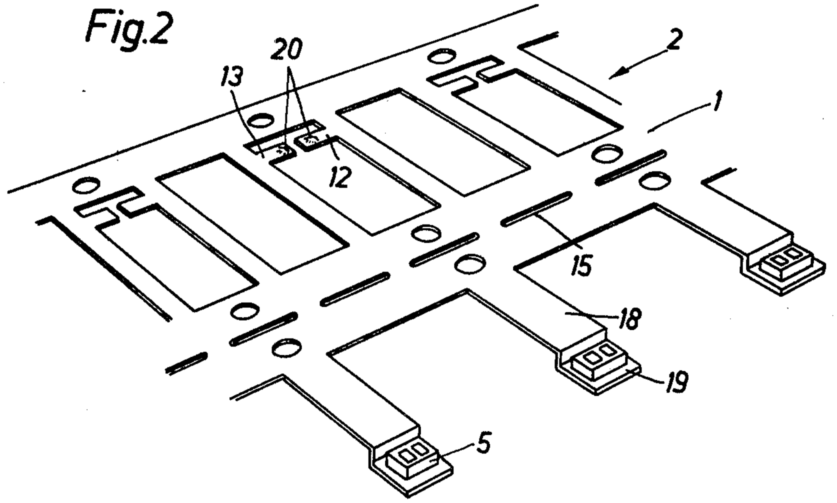
FIGURE 2 is a perspective view of a second conductive strip to be utilized in the method of this invention.

FIGURE 2 shows a somewhat differently constructed conductive strip which does not have a longitudinal member 7 (FIGURE 1). The free ends of tongues or teeth 18 in this case are bent twice at right angles in opposite directions so that the tooth portion 19 intended to hold the semiconductor body 5 lies parallel to the actual plane of the strip but below it by an amount approximately equal to the thickness of the semiconductor body 5. After the semiconductor body 5 has been soldered to the angled portions 19, only the connection points for the emitter and base electrodes extend above the actual plane of the teeth 18. Protuberances 20 are pressed into tongues 12 and 13 of ladder 2, which protuberances will cover the contact points of semiconductor body 5 when the teeth 18 are folded over ladder 2 and are soldered thereto or connected therewith by thermocompression. The conductive strip according to FIGURE 2 is provided with a continuous central longitudinal member 1 of even width throughout having perforations 15 in the center thereof. Thus, upon completion of soldering the semiconductor devices to the teeth 18, either the entire conductive strip can be folded over along the perforations 15, or an incision extending to the perforation can be subsequently made between each two teeth 18 so that the teeth 18 can be folded over individually onto associated portions of ladder 2.

Figure 3:
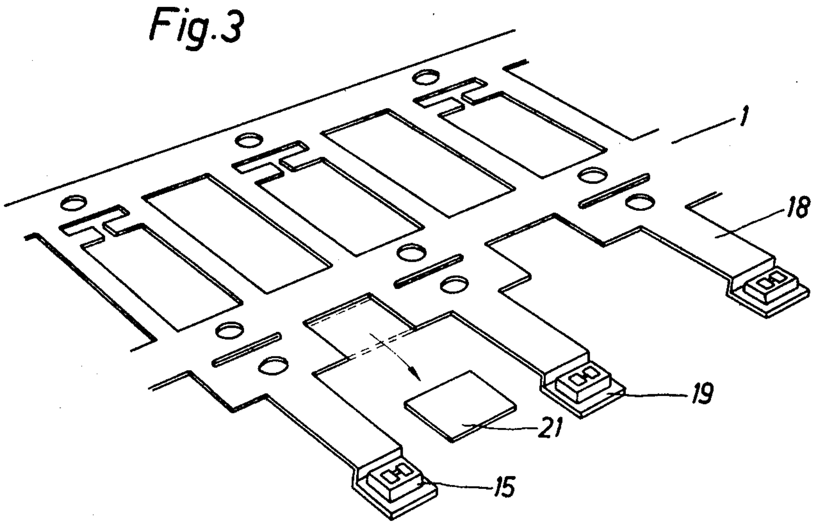
FIGURE 3 is a perspective view of a modification of the conductive strip shown in FIGURE 2.

It is further possible, as shown in FIGURE 3, to cut or etch out a piece 21 from the conductive strip between two teeth or tongues 18, respectively, extending to the perforation.

The conductive strip preferably consists of a metal whose expansion coefficient corresponds to that of the semiconductor material. It is further preferable to gold-plate the contacting rungs or teeth or to cover them with a solder layer at those portions thereof which are intended to contact the semiconductor bodies.

Figure 4:
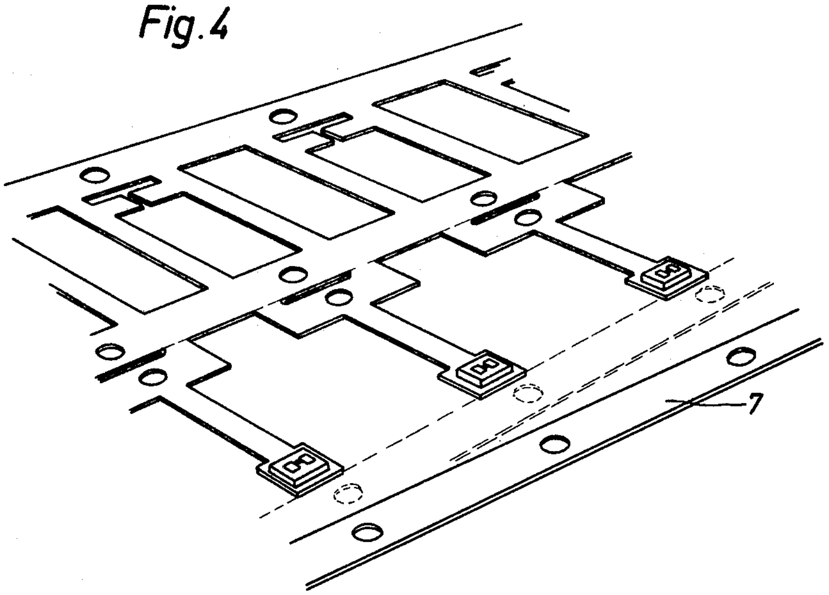
FIGURE 4 is a perspective view of the conductive strip shown in FIGURE 1 with one portion thereof cut off.
Figure 5:
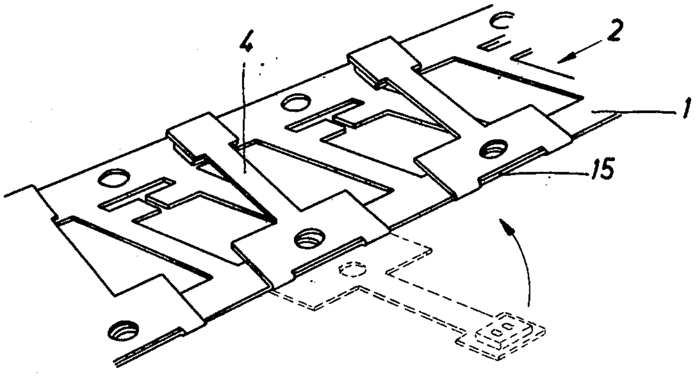
FIGURE 5 is a perspective view of the conductive strip shown in FIGURE 4 with the rung elements thereof partially bent over.
Figure 6:
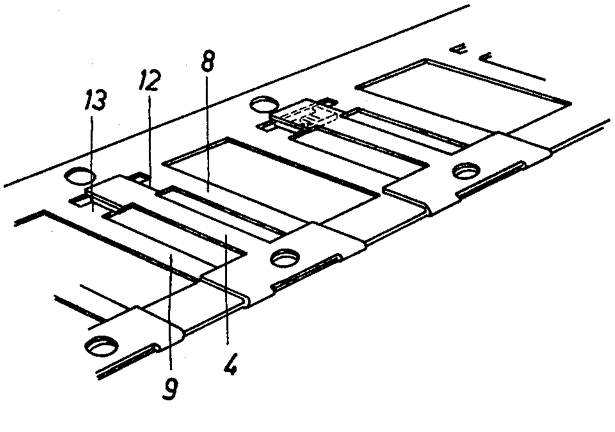
FIGURE 6 is a perspective view of the conductive strip shown in FIGURE 5 with the rung elements thereof completely bent over.

In one automatic fabricating machine, the pre-sorted semiconductor bodies 5 are placed onto rungs 4 or contacting teeth 18, respectively, and are soldered to their respective strip portions in the heating zone of the machine. If a conductive strip according to FIGURE 1 is used, the outer longitudinal member 7 is separated from the contacting strip after the semiconductor bodies 5 are soldered in place, as can be seen in FIGURE 4. This step in the manufacturing process, as well as all previous and subsequent steps, can be performed completely automatically. Subsequently, as is shown in FIGURE 5, the rungs 4 are folded in the direction of the arrow onto the center bar 1 around the axis formed by the perforation so that the emitter electrode and the base electrode contacts the tongues 12 and 13 of rungs 8 and 9, as shown in FIGURE 6. Then, for example, a heated member is pressed against the underside of tongues 12 and 13 to heat the contacting portions so as to solder the electrodes of the semiconductor body to the tongues 12 and 13 of the conductive strip. It is preferable in this soldering operation to simultaneously place a weight on the rungs 4 from above to create a counterpressure. In another case, the tongues 12 and 13 can be pressed against the contacting points on the semiconductor body at a temperature which is below the soldering temperature in such a manner that a cold soldering or thermocompression connecting results. The superposed portions of the original longitudinal member 1 can be compressed, clamped together, welded, or soldered together to prevent them from tending to open and jam the automatic machinery.

Figure 7:
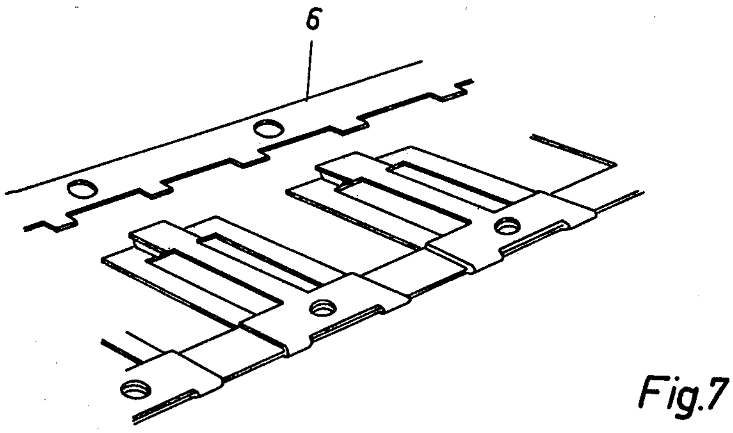
FIGURE 7 is a perspective view of the conductive strip shown in FIGURE 6 with a portion thereof cut away.
Figure 8:
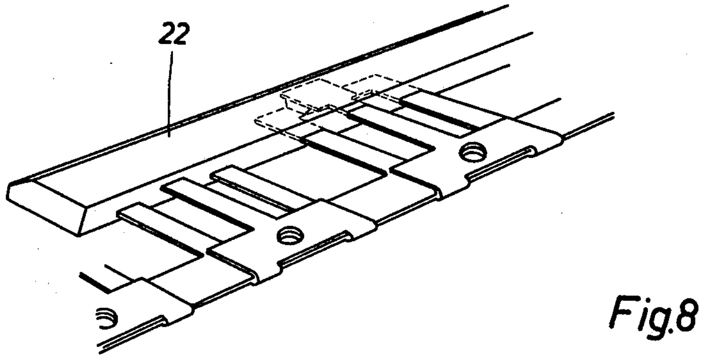
FIGURE 8 is a perspective view of the conductive strip shown in FIGURE 7 with the semiconductor bodies thereon and the adjacent rung elements encapsulated in an insulating material.
Figure 9:
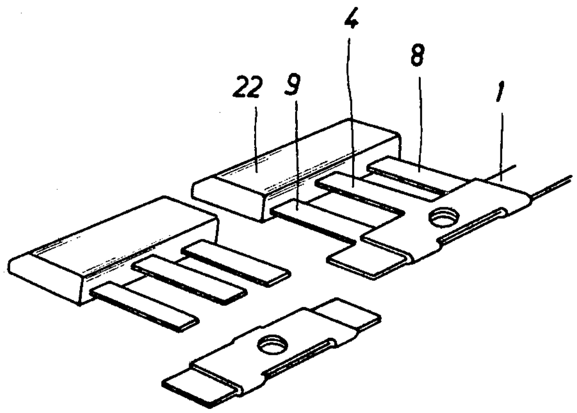
FIGURE 9 is a perspective view of the encapsulated strip shown in FIGURE 8 with the individual semiconductor devices thereof divided and the rung elements of one semiconductor device completely separated from the conductive strip.
Figure 10:
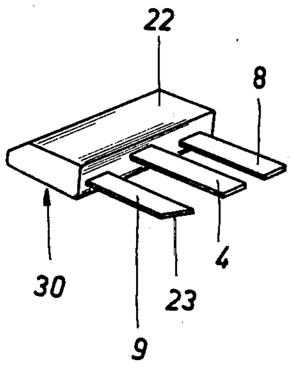
FIGURE 10 is a perspective view of a subminiature transistor produced in accordance with the method of this invention.

Subsequently, as shown in FIGURE 7, the outer longitudinal member 6 is removed or etched away, and the semiconductor bodies are then encapsulated in plastic, together with the contact points. For this purpose, the entire conductive strip including the free ends of the rungs is dipped into a trough filled with liquid plastic, e.g., casting resin. After the plastic has hardened, the sensitive portions of the semiconductor elements are practically undamaged and are surrounded by an insulating material 22 as shown in FIGURE 8. As shown in FIGURE 9, the longitudinal member 1 connecting rungs 4, 8 and 9 is then removed, so that the electrodes of the semiconductor device are completely separated from each other and are accessible via the portions of the conductive strip which extend out of the insulating material 22. While they are still held together by the connecting plastic, the semiconductor devices can be measured and marked. An individual semiconductor device 30, which is shown in FIGURE 10 as being separated from the remaining semiconductor devices, represents an operable subminiature transistor without a housing whose emitter lead 9 is marked by a diagonally cut end 23. With a marking like this, or some other suitable marking, the individual leads of the transistor can be easily identified. The subminiature transistors 30 shown in FIGURE 10 can also be incorporated into integrated circuits which consist of resistors, capacitors and other structural elements deposited on a ceramic wafer. For this purpose, the electrode leads 4, 8 and 9 can be angled in such a manner that they can be easily soldered or welded to the associated conductive paths disposed on the wafer.

Figure 11:
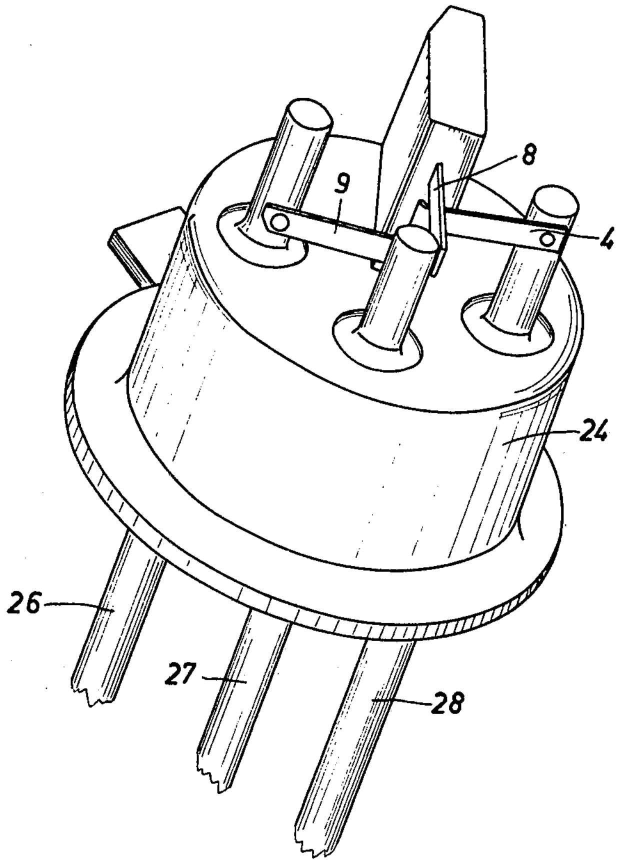
FIGURE 11 is a perspective view of the subminiature transistor of FIGURE 10 coupled to the base structure of a standard transistor.

FIGURE 11 shows how a subminiature transistor 30 according to FIGURE 10 is attached to a conventional housing. The housing base 24 is provided with three prongs 26, 27 and 28 to whose structural side the angled electrode leads 4, 8 and 9 of the subminiature transistor are soldered. The base 24 is then enclosed in a housing cap.

The method according to the present invention can also be used to manufacture other types of semiconductor devices. For diodes, each one of the ladders forming a conductive strip will be provided with only one rung, tongue, or tooth element to contact one electrode of the diodes. For integrated circuits, the semiconductor device must be placed approximately in the center of each contacting rung on the one ladder while the other ladder which completes the contacting strip is provided with as many inwardly extending rungs or tongues attached to rungs as necessary for contacting the electrodes so that when the strip portions are folded together, all contact points will be simultaneously and wirelessly contacted. In this case, the semiconductor devices and the contact points are also embedded in an insulating material, and the strip portions extending out of the insulating material can be used as electrode leads. A marking of the leads or of the insulating material facilitates orientation during use of the circuit.

The essence of the invention, whose details are variable, therefore resides in a method for attaching electrode leads to semiconductor devices in a fully automatic fabrication process. The economy in personnel and manufacturing costs is substantial and decisive for mass-production under present-day requirements.

It will be understood that the above description of the present invention is susceptible to various modifications, changes, and adaptations.

What I claim is:

1. A method of manufacturing wire contact-free semiconductor devices from a flat strip of conductive material and a plurality of semiconductor bodies each having at least two different conductivity zones, comprising the steps of:

(a) forming at least two groups of elongated elements in said flat strip of conductive material on opposite edges of a web of said conductive material which connects said groups together, each elongated element of the first group being dimensioned and positioned to support one of such semiconductor bodies and to make contact with the first conductivity zone thereof, and each elongated element of the second group being dimensioned and positioned to make contact with the second conductivity zone of a corresponding semiconductor body supported by an elongated element of the first group when said rung elements are moved toward each other;

(b) placing such a semiconductor body on each elongated element of the first group with the first conductivity zone of the semiconductor body in contact with the corresponding elongated element;

(c) moving the elongated elements of the first and second groups toward each other until the elongated elements of the second group make contact with the second conductivity zone of the corresponding semiconductor body;

(d) attaching said elongated elements to said semiconductor bodies at their points of contact; and (e) cutting said elongated elements loose from said flat strip of conductive material to form a plurality of semiconductor devices each having a conductive lead attached to and projecting from each different conductivity zone of said semiconductor bodies.

2. The method defined in claim 1 and further comprising the step of encapsulating said semiconductor bodies and the portion of said elongated elements attached thereto with an insulating material after step (d) and before step (e).

3. The method defined in claim 1 and further comprising the step (f) of attaching the conductive leads of each of said semiconductor devices to a corresponding lead of a housing base.

4. The method as defined in claim 1 wherein said semiconductor bodies each comprise a planar transistor body whose collector zone is to be contacted on one surface thereof and whose base and emitter zones are to be contacted on the opposite surface thereof, and further comprising the step of forming a third group of elongated elements in said flat strip of conductive material, each elongated element of said third group being dimensioned and positioned to contact the third conductivity zone of the planar transistor body, and moving the elongated elements of said third group into contact with the corresponding planar transistor body.

5. The method as defined in claim 4 wherein the base and emitter contacts of the planar transistor bodies are connected, via transmitting paths disposed on the surface of the transistor bodies, to metallically covered platforms of insulating material disposed on the surface of the transistor bodies.

6. The method as defined in claim 5 wherein indentations are made in those elongated elements which are to be placed in an electrically conductive connection with the emitter and the base contact of the planar transistor bodies so that protuberances are created on the surface of the elongated elements facing the emitter and base contacts of the planar transistor bodies.

7. The method as defined in claim 4 wherein said flat strip of conductive material is shaped in the form of two ladders connected by a common longitudinal member, and wherein the rungs of one ladder serve as elongated elements to support and to contact the collector zones of the planar transistor bodies and wherein the rungs of the other ladder serve as elongated elements to contact the base and the emitter zones of the planar transistor bodies.

8. The method as defined in claim 7 wherein the adjacent rungs of one of said ladders contain inwardly projecting tongues two of which are associated with each of said planar transistor bodies, each pair of tongues which are associated with one of said transistor bodies being separated from each other by a narrow slit, and each of said pairs of tongues being dimensioned and positioned to contact the base and the emitter portions of the corresponding transistor body.

9. The method as defined in claim 8 wherein said common longitudinal member is perforated in its center to permit one ladder shaped portion of the flat conductive strip to be folded over the other ladder shaped portion thereof.

10. The method as defined in claim 7 wherein said common longitudinal member is perforated in its center by longitudinal slits to permit one ladder shaped portion of the flat conductive strip to be folded over the other ladder shaped portion thereof, and wherein a portion of said longitudinal member is removed between the rungs of one of said ladder shaped portions up to the corresponing slit in said common longitudinal member.

11. The method as defined in claim 1 wherein said strip of conductive material is made of a metal whose temperature expansion coefficient corresponds to that of the semiconductor body, and wherein said elongated elements are gold-plated and are covered with a solder layer at those points which are intended to contact the semiconductor body.

12. The method as defined in claim 7 wherein one rung is provided to accept the planar transistor bodies on one ladder shaped portion of the conductive strip, and wherein two rungs, both provided with contacting tongues, are provided on the other ladder shaped portion of the conductive strip to contact the emitter and base zones of the planar transistor bodies.

13. The method as defined in claim 9 wherein a plurality of planar transistor bodies are soldered to the associated rungs of the one ladder, the outer longitudinal member of said ladder which connects these rungs being subsequently removed, and wherein each rung containing a transistor body is then turned by 180° around the perforation of the common longitudinal member until the transistor body contacts the tongues projecting from the rungs of the other ladder, the tongues then being connected to the corresponding conductivity zones of the transistor bodies, the other outer longitudinal member of the other ladder being removed and the transistor bodies being encapsulated, together with the contacting portion of said rungs, in an insulating material, and wherein the common longitudinal member of said two ladders is then removed to separate the transistor bodies and the portion of said rungs attached thereto.

14. The method as defined in claim 1 wherein said strip of conductive material is a stamped metal strip.

15. The method as defined in claim 1 wherein said strip of conductive material is a photoetched metal strip.

16. The method as defined in claim 1 wherein holes are made in said strip of conductive material to facilitate movement of the strip through automatic fabricating machinery.

17. The method as defined in claim 8 wherein the rungs or tongues of the strip of conductive material are pressed against the electrodes of the transistor body to make contact with the corresponding conductivity zones thereof.

18. The method as defined in claim 1 wherein said strip of conductive material is shaped in the form of two ladders connected together by a common longitudinal member whereby the elongated elements of the ladder which is intended to support the semiconductor bodies are connected to each other only via the common longitudinal member.

19. The method as defined in claim 18 wherein the elongated elements intended to support the semiconductor bodies are angled twice in opposite directions and wherein the semiconductor bodies are soldered on those angled portions of the elongated elements which are parallel to the plane of the conductive strip.

20. The method as defined in claim 2 wherein a marking is provided either on the insulating material protecting the semiconductor devices or on the elongated elements extending out of the insulating material to indicate the arrangement of the electrodes.

References Cited

UNITED STATES PATENTS

| | | | |
|---|---|---|---|
| 3,171,187 | 3/1965 | Ikeda et al. | 29—588 |
| 3,176,191 | 3/1965 | Rowe | 29—589 |
| 3,264,712 | 8/1966 | Hayashi et al. | 29—588 |
| 3,264,715 | 8/1966 | Siebertz | 29—630 |
| 3,281,628 | 10/1966 | Bauer et al. | 29—588 |
| 3,367,025 | 2/1968 | Doyle | 29—588 |
| 3,371,836 | 3/1968 | Forster et al. | 174—52 |
| 3,423,516 | 1/1969 | Segerson | 29—588 |

PAUL M. COHEN, Primary Examiner

U.S. Cl. X.R.

29—588, 589, 630; 174—52